United States Patent
Ghannam et al.

(10) Patent No.: US 10,527,464 B2
(45) Date of Patent: Jan. 7, 2020

(54) ROTATABLE SENSOR COVER

(71) Applicant: Ford Global Technologies, LLC, Dearborn, MI (US)

(72) Inventors: Mahmoud Yousef Ghannam, Canton, MI (US); Saied Nusier, Canton, MI (US); Swadad A. Carremm, Canton, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 435 days.

(21) Appl. No.: 15/241,055

(22) Filed: Aug. 18, 2016

(65) Prior Publication Data
US 2018/0052019 A1 Feb. 22, 2018

Related U.S. Application Data

(63) Continuation of application No. 15/240,953, filed on Aug. 18, 2016.

(51) Int. Cl.
| | | |
|---|---|---|
| *G01D 11/24* | (2006.01) | |
| *H05K 5/03* | (2006.01) | |
| *G01B 21/22* | (2006.01) | |
| *H05K 5/00* | (2006.01) | |
| *H05K 5/02* | (2006.01) | |

(52) U.S. Cl.
CPC .......... *G01D 11/245* (2013.01); *G01B 21/22* (2013.01); *H05K 5/0013* (2013.01); *H05K 5/0226* (2013.01); *H05K 5/0239* (2013.01); *H05K 5/0247* (2013.01); *H05K 5/03* (2013.01)

(58) Field of Classification Search
CPC .... G01D 11/24; G01D 11/245; H05K 5/0226; H05K 5/03; H05K 5/0091
See application file for complete search history.

(56) References Cited

U.S. PATENT DOCUMENTS

| | | |
|---|---|---|
| 254,144 A | 2/1882 | Lemon |
| 615,420 A | 12/1898 | Baker |
| 663,397 A | 12/1900 | Stoneburner et al. |
| 683,663 A | 10/1901 | Reinecke et al. |

(Continued)

FOREIGN PATENT DOCUMENTS

| | | |
|---|---|---|
| CN | 201298044 Y | 8/2009 |
| CN | 203485859 U | 3/2014 |

(Continued)

OTHER PUBLICATIONS

SAAB Rain Sensor Cover, image post date 2000, site visited May 7, 2017, (online), <https://www.eeu roparts.com/Parts/57222/Rai n-Sensor-Cover -12796773/>.

(Continued)

*Primary Examiner* — Erika J Villaluna
(74) *Attorney, Agent, or Firm* — Frank Lollo; Eversheds Sutherland (US) LLP (57) ABSTRACT

An assembly for a vehicle includes: a top housing rotatable about a bottom housing via a hinge; a sensor positioned between the top and bottom housings; the top and bottom housings each including a triangular portion that narrows into a rectangular extension portion; the bottom housing including raised bosses defining bolt apertures; the housings including outward indentations and corresponding inward indentations.

22 Claims, 12 Drawing Sheets

(56) References Cited

U.S. PATENT DOCUMENTS

| | | | |
|---|---|---|---|
| 705,716 A | 7/1902 | Stuart et al. |
| 743,411 A | 11/1903 | Agnell et al. |
| 743,518 A | 11/1903 | Kelly et al. |
| 751,462 A | 2/1904 | Clapham |
| 767,786 A | 8/1904 | Wheeler et al. |
| 768,400 A | 8/1904 | Piper et al. |
| 2,544,144 A | 3/1951 | Ellis |
| 3,915,476 A | 10/1975 | Burkle |
| 4,017,136 A | 4/1977 | Sasgen |
| 4,343,522 A | 8/1982 | O'Neil |
| 4,539,621 A | 9/1985 | Currier |
| 4,553,433 A * | 11/1985 | Hicks ................ G01F 15/14 73/273 |
| D294,922 S | 3/1988 | Nagy |
| 4,738,641 A | 4/1988 | Eversole, Jr. |
| 4,781,393 A | 11/1988 | Jeter |
| 4,864,288 A | 9/1989 | Cross |
| 4,993,803 A | 2/1991 | Suverison |
| D345,127 S | 3/1994 | Stenglein |
| 5,302,141 A | 4/1994 | O'Reilly |
| 5,458,357 A | 10/1995 | Wohlhuter |
| 5,558,350 A | 9/1996 | Kimbrough |
| 5,627,315 A | 5/1997 | Figi |
| 5,660,408 A | 8/1997 | Johnson |
| 5,765,848 A | 6/1998 | Silvey |
| 5,863,227 A | 1/1999 | Bell, Jr. |
| D407,656 S | 4/1999 | Klever |
| D421,576 S | 3/2000 | Clivio |
| 6,066,933 A | 5/2000 | Ponziana |
| 6,392,218 B1 | 5/2002 | Kuehnle |
| 6,398,252 B1 | 6/2002 | Ishikawa |
| 6,502,839 B1 | 1/2003 | Chino et al. |
| 6,638,083 B2 | 10/2003 | Rhude |
| 6,761,296 B2 | 7/2004 | Ford et al. |
| D518,420 S | 4/2006 | Schmidt |
| D537,388 S | 2/2007 | Martell |
| D579,833 S | 11/2008 | Acenbrak |
| D581,298 S | 11/2008 | Beaujard et al. |
| 7,491,065 B2 | 2/2009 | Wagner |
| D623,121 S | 9/2010 | Lewis |
| D625,622 S | 10/2010 | Mallela |
| 7,889,062 B1 | 2/2011 | Albisa |
| 7,932,623 B2 | 4/2011 | Burlak |
| D651,964 S | 1/2012 | Sakae |
| 8,177,292 B1 | 5/2012 | Baccouche et al. |
| D661,630 S | 6/2012 | Fehring |
| D663,397 S | 7/2012 | Yeung |
| D664,284 S | 7/2012 | Komarov et al. |
| D665,249 S | 8/2012 | Hernandez |
| D666,891 S | 9/2012 | Gulseth |
| D683,663 S | 6/2013 | Foley |
| 8,475,176 B2 | 7/2013 | Holmes |
| D705,716 S | 5/2014 | Newman |
| 8,894,121 B2 | 11/2014 | Eilers et al. |
| D719,887 S | 12/2014 | Hensel et al. |
| D719,896 S | 12/2014 | Sakae |
| 8,907,663 B2 | 12/2014 | Lee |
| 8,955,864 B2 | 2/2015 | Palen |
| D724,330 S | 3/2015 | Toll |
| 8,966,975 B2 | 3/2015 | Campbell et al. |
| D726,094 S | 4/2015 | Simecek et al. |
| D729,691 S | 5/2015 | Baron |
| D736,141 S | 8/2015 | Sakae |
| 9,120,219 B1 | 9/2015 | Liao et al. |
| 9,124,032 B2 | 9/2015 | Arakelian |
| D741,780 S | 10/2015 | Lee |
| D742,718 S | 11/2015 | Bouthillier |
| D742,797 S | 11/2015 | Sugiura |
| D743,239 S | 11/2015 | Jones, Jr. et al. |
| D743,411 S | 11/2015 | Zenri |
| D744,073 S | 11/2015 | Waggoner et al. |
| 9,199,592 B1 | 12/2015 | Nusier et al. |
| D747,225 S | 1/2016 | Decook et al. |
| D750,706 S | 3/2016 | Kim et al. |
| D751,023 S | 3/2016 | Hennen |
| D751,462 S | 3/2016 | Baron |
| D754,449 S | 4/2016 | Lam |
| D762,462 S | 8/2016 | Anderson |
| D764,822 S | 8/2016 | Toll |
| D766,130 S | 9/2016 | Baron |
| D767,908 S | 10/2016 | Berry et al. |
| D768,400 S | 10/2016 | Berry et al. |
| D769,034 S | 10/2016 | Lawson |
| D769,235 S | 10/2016 | Li |
| D773,839 S | 12/2016 | Player |
| D774,791 S | 12/2016 | Toll |
| D775,036 S | 12/2016 | Shafer |
| D775,537 S | 1/2017 | Kikstra |
| D775,561 S | 1/2017 | Platto et al. |
| D775,565 S | 1/2017 | Shafer |
| D776,165 S | 1/2017 | Ellison et al. |
| D776,747 S | 1/2017 | Lenihan |
| D778,184 S | 2/2017 | Kikstra |
| D783,463 S | 4/2017 | Reed |
| D784,033 S | 4/2017 | Li |
| D785,052 S | 4/2017 | Underhill et al. |
| D797,646 S | 9/2017 | Ghannam |
| 2002/0096517 A1 | 7/2002 | Gelardi |
| 2005/0206225 A1 | 9/2005 | Offerle |
| 2006/0022531 A1 | 2/2006 | Tenca et al. |
| 2006/0156806 A1 | 7/2006 | Peterson |
| 2007/0072461 A1 | 3/2007 | Williams |
| 2007/0256946 A1 | 11/2007 | Godshaw et al. |
| 2008/0164707 A1 | 7/2008 | Belwafa et al. |
| 2008/0203782 A1 | 8/2008 | Bigolin |
| 2009/0039127 A1 | 2/2009 | Dacko |
| 2009/0152912 A1 | 6/2009 | Yu |
| 2009/0193632 A1 | 8/2009 | Yeh |
| 2010/0026029 A1 | 2/2010 | Easling |
| 2010/0206021 A1 | 8/2010 | Tribout et al. |
| 2011/0006027 A1 | 1/2011 | Domoy et al. |
| 2011/0185812 A1 | 8/2011 | Raschke |
| 2011/0285176 A1 | 11/2011 | Baccouche et al. |
| 2013/0253814 A1 | 9/2013 | Wirthlin |
| 2013/0256353 A1 | 10/2013 | Angeli et al. |
| 2013/0272009 A1 | 10/2013 | Fujiu et al. |
| 2014/0036522 A1 | 2/2014 | Nakada |
| 2014/0060882 A1 | 3/2014 | Ellis et al. |
| 2014/0286031 A1 | 9/2014 | Marcori et al. |
| 2015/0051795 A1 | 2/2015 | Keys, II |
| 2015/0202402 A1 | 7/2015 | Kat |
| 2015/0225137 A1 | 8/2015 | Wei et al. |
| 2015/0258953 A1 | 9/2015 | Murray, Jr. |
| 2015/0331087 A1 | 11/2015 | Philipp et al. |
| 2016/0033621 A1 | 2/2016 | Ottenhues et al. |
| 2016/0106214 A1 | 4/2016 | Hagen |
| 2016/0116666 A1 | 4/2016 | Sato |
| 2016/0264314 A1 | 9/2016 | Bristow |
| 2016/0282466 A1 | 9/2016 | Epler |
| 2016/0264315 A1 | 11/2016 | Downey et al. |
| 2016/0372832 A1 | 12/2016 | Park et al. |
| 2017/0062929 A1 | 3/2017 | Abe |
| 2017/0107022 A1 | 4/2017 | Lee |

FOREIGN PATENT DOCUMENTS

| | | | |
|---|---|---|---|
| EP | 2025536 A1 | 2/2009 | |
| EP | 2918545 A1 | 9/2015 | |
| JP | 10316393 A | 12/1998 | |
| JP | 2001025135 A * | 1/2001 | ............ B65D 45/18 |
| JP | 4057246 B2 | 3/2008 | |
| KR | 20120059907 A | 6/2012 | |
| WO | WO 84/02613 A1 | 7/1984 | |
| WO | WO 2008/003664 A1 | 1/2008 | |
| WO | WO 2013/119276 A1 | 8/2013 | |

OTHER PUBLICATIONS

P2M Nissan SR200ET Billet Aluminum Crank Angle Sensor Cover Silver P2-CASNSR20S-GO, image post date Jul. 3, 2015; site visited May 7, 2017, (online), <https://guide.alibaba.com/shop/p2m-nissan-sr20det-billet-aluminum-crank-angle-sensor-coversilver-p2-casnsr20s-gd_59449234.html>.

(56) References Cited

OTHER PUBLICATIONS

Genuine Ford Rain Sensor Cover 1798226, image post date 2008, site visited May 7, 2017, (online), <https://picclick.co.uk/Genuine-Ford-Rain-Sensor-Cover-1798226-122136621218.html>.
Unpublished pending U.S. Appl. No. 152409531, filed Aug. 18, 2016 which is not being furnished herewith, pursuant to the Commissioner's Notice dated Sep. 21, 2004.
Unpublished pending U.S. Appl. No. 29/574,795, filed Aug. 18, 2016 which is not being furnished herewith, pursuant to the Commissioner's Notice dated Sep. 21, 2004.
Unpublished pending U.S. Appl. No. 29/574,798, filed Aug. 18, 2016 which is not being furnished herewith, pursuant to the Commissioner's Notice dated Sep. 21, 2004.
Unpublished pending U.S. Appl. No. 29/574,799, filed Aug. 18, 2016 which is not being furnished herewith, pursuant to the Commissioner's Notice dated Sep. 21, 2004.
Unpublished pending U.S. Appl. No. 29/574,821, filed Aug. 18, 2016 which is not being furnished herewith, pursuant to the Commissioner's Notice dated Sep. 21, 2004.
OEM Windshield Rain Sensor Cover, image post date 2013, site visited May 9, 2017, (online), <http://www.ebay.com/itm/BRAND-NEW-OEM-WINDHSIELF-RAIN-SENSOR-COVER-FORD-LINCOLN-MERCURY-9L3Z-17D550-A/361181938502>.
Imfsoft aluminium timing cover, image post date Aug. 15, 2014, site visited Jan. 9, 2017, (online), <http://www.mjscrane.com/panhard/ignition/>.
Search Report dated Jan. 24, 2018, for GB Patent Application No. 1713041.0 (4 pages).
Sensor Cover & Base Plate, image post date Mar. 18, 2016, site visited May 7, 2017, (online), <https://web.archive.org/web/20160318031405/http://thermalcomp.com/products/sensor-components/>.

\* cited by examiner

ROTATABLE SENSOR COVER

CROSS-REFERENCE TO RELATED APPLICATION

This application is a continuation of, and claims priority to U.S. patent application Ser. No. 15/240,953 which was filed on Aug. 18, 2016, which is hereby incorporated by reference in its entirety. This application also relates to Design application Ser. Nos. 29/574,795, 29/574,798, 29/574,799 and 29/574,821 all which were filed on Aug. 18, 2016, all of which are hereby incorporated by reference in their entireties.

TECHNICAL FIELD

This disclosure relates to sensors and sensor covers.

BACKGROUND

Existing vehicles, such as trucks and trailers, include autonomous driving technologies (e.g., automatic parking programs or automatic steering programs) that depend on accurate sensor measurements. To produce reliable measurements, sensors should be protected from damaged via sensor covers.

SUMMARY

An assembly includes (a) a sensor comprising a bolt connector, an anti-rotator configured to snap-fit into a recess, and rails; (b) a cover comprising a plurality of slots configured to receive the rails and being sized to leave a portion of the bolt connector laterally exposed when finally positioned over the sensor.

According to various embodiments, at least one of the slots is a snap slot.

According to various embodiments, the snap slot includes a tongue and lip configured to snap fit over an end of one of the rails.

According to various embodiments, at least two of the slots are snap slots.

According to various embodiments, the snap slots are located on opposing sides of the cover.

According to various embodiments, the tongues of the snap slots have different lengths.

According to various embodiments, the bolt connector defines a bolt hole and a nut sits in the bolt hole.

According to various embodiments, the nut is longer than the bolt hole such that top and bottom surfaces of the nut protrude from the bolt hole.

According to various embodiments, the rails include a first rail, a second rail, and a third rail.

According to various embodiments, the first rail is shorter than the second and third rails.

According to various embodiments, the first rail protrudes from the bolt connector.

According to various embodiments, the snap slot with the longer tongue engages the first rail.

According to various embodiments, the first rail protrudes from the sensor in a first direction, the second rail protrudes from the sensor in a second direction, and the third rail protrudes from the sensor in a third direction.

According to various embodiments, the first direction is parallel with the second direction and both of the first and second directions are perpendicular to the third direction.

According to various embodiments, the sensor comprises a power supplier with a plurality of power supply rails.

According to various embodiments, the power supplier terminates at a first end and at least two of the plurality of power supply rails are flush with the first end.

According to various embodiments, the cover is sized to expose at least a portion of each of the plurality of power supply rails, such that when the cover is finally positioned over the sensor, the exposed rails are externally visible.

According to various embodiments, the cover includes an attachment ribbon.

According to various embodiments, the attachment ribbon includes a flexible extension and a cylindrical hoop.

An assembly for a vehicle includes a top housing rotatable about a bottom housing via a hinge; a sensor positioned between the top and bottom housings; the top and bottom housings each comprising a triangular portion that narrows into a rectangular extension portion; the bottom housing comprising raised bosses defining bolt apertures; the housings comprising outward indentations and corresponding inward indentations.

According to various embodiments, the top housing is rotatable about the bottom housing to an open position and a closed position.

According to various embodiments, in the closed position, the outward indentations sit on the inward indentations.

According to various embodiments, in the closed position, the indentations cooperate to retain the top housing in the closed position.

According to various embodiments, the inward indentations are symmetrical and the outward indentations are symmetrical.

According to various embodiments, the top housing comprises a hood outwardly protruding from the extension portion of the top housing.

According to various embodiments, the hinge comprises two apertures defined by two parts protruding from the top housing and another two apertures defined by another two parts protruding from the bottom housing.

According to various embodiments, a pin extends through the apertures.

According to various embodiments, the hinge comprises two retaining clips mounted on opposing ends of the pin.

According to various embodiments, the bottom housing comprises an upper surface and the bosses are raised above the upper surface.

According to various embodiments, the sensor sits on at least one of the bosses such that no portion of the sensor contacts the upper surface of the bottom housing.

According to various embodiments, the sensor comprises a bolt connector defining a bolt aperture and a nut fitted inside the bolt aperture.

According to various embodiments, the nut is longer than the bolt aperture such that a lower surface of the nut protrudes from the bolt aperture.

According to various embodiments, the lower surface of the nut sits directly on the boss.

According to various embodiments, the bosses are offset such that the bosses are not collinear along a line extending parallel to the hinge.

According to various embodiments, the assembly includes an electrical connector engaged to the sensor, the electrical connector including a primary portion and a cord; wherein the top and bottom housings are sized to cover the sensor, the primary portion of the electrical connector, and only a portion of the cord.

According to various embodiments, the top housing comprises a plurality of outer ribs.

According to various embodiments, the ribs engage an upper sealing surface of the bottom housing when the top housing is in the closed position.

According to various embodiments, the assembly includes an attachment ribbon with a flexible extension and a hoop.

According to various embodiments, the triangular portions smoothly and continuously narrow into the rectangular extension portions such that the narrows do not define edges.

BRIEF DESCRIPTION OF THE DRAWINGS

For a better understanding of the invention, reference may be made to embodiments shown in the following drawings. The components in the drawings are not necessarily to scale and related elements may be omitted, or in some instances proportions may have been exaggerated, so as to emphasize and clearly illustrate the novel features described herein. According to some embodiments, non-perspective views are to scale. In addition, system components can be variously arranged, as known in the art. Further, in the drawings, like reference numerals designate corresponding parts throughout the several views.

DETAILED DESCRIPTION OF EXAMPLE EMBODIMENTS

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects. Further, the conjunction "or" may be used to convey features that are simultaneously present, as one option, and mutually exclusive alternatives as another option. In other words, the conjunction "or" should be understood to include "and/or" as one option and "either/or" as another option.

Figure 1:
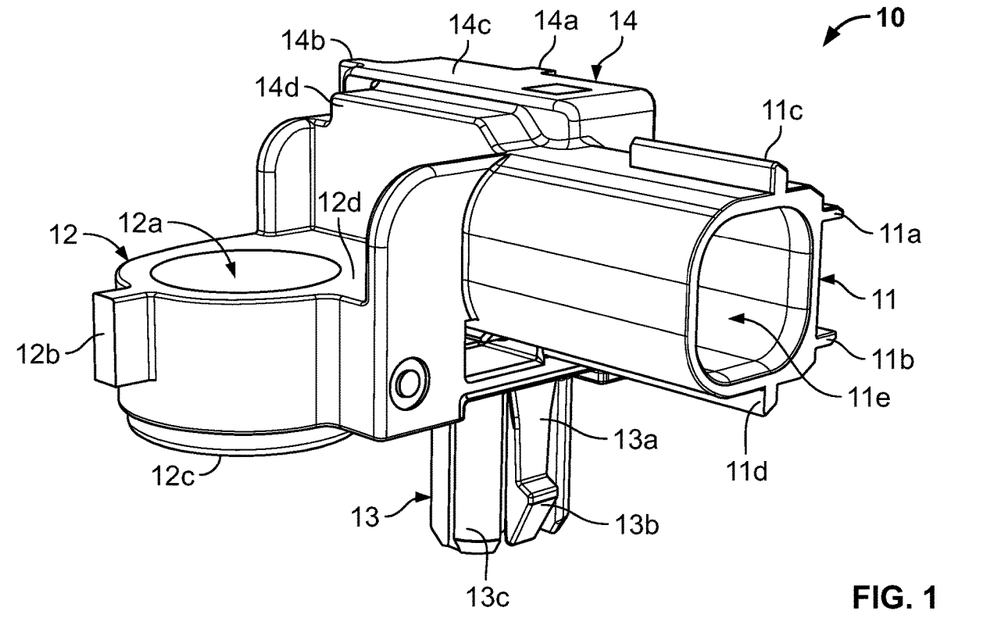
FIG. 1 is a front perspective view of a sensor.
Figure 2:
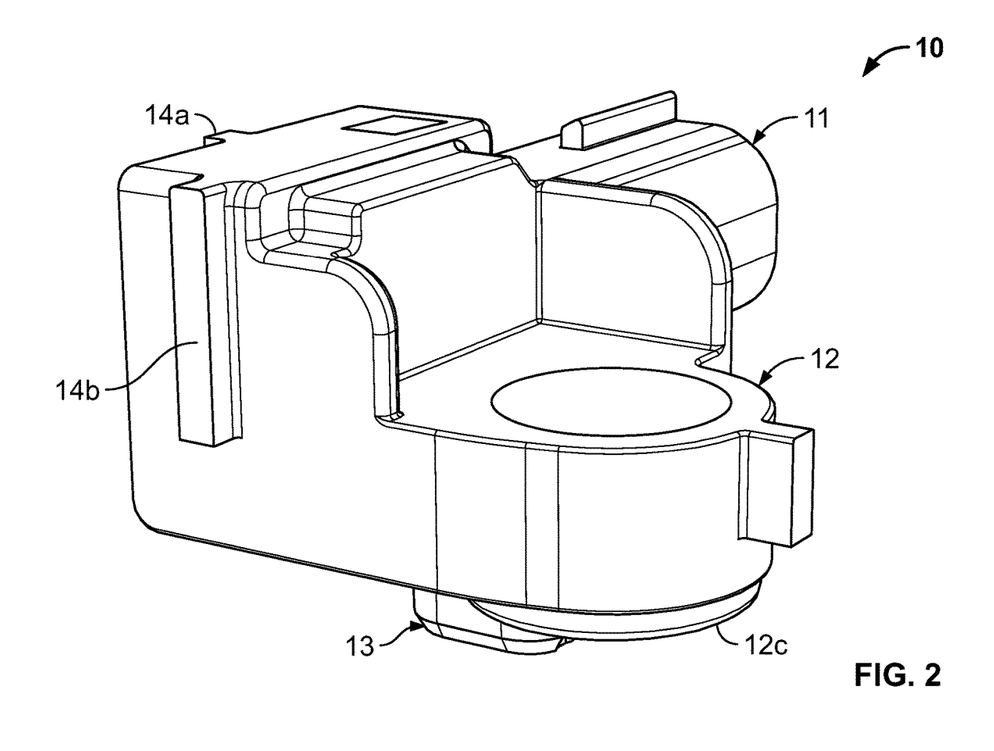
FIG. 2 is a rear perspective view of the sensor.
Figure 3:
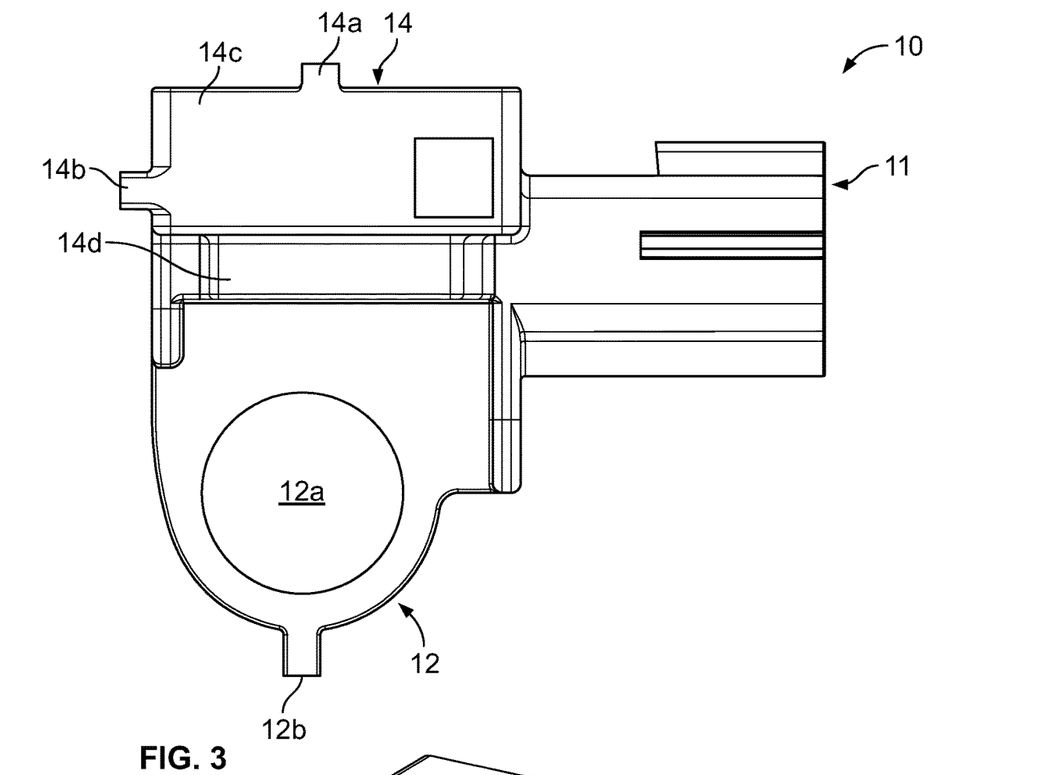
FIG. 3 is a top plan view of the sensor.

FIGS. 1 to 3 generally shows and illustrates a sensor 10. The sensor 10 may include internal electronic components configured to measure a dimension, such as yaw. As shown in FIG. 1, the sensor 10 includes (a) a power supply portion 11 (also referred to as a power supplier 11), (b) a bolt connection portion 12 (also referred to as a bolt connector 12), (c) an anti-rotation portion 13 (also referred to as anti-rotator 13), and (d) a main housing portion 14 (also referred to as main housing 14).

Figure 5:
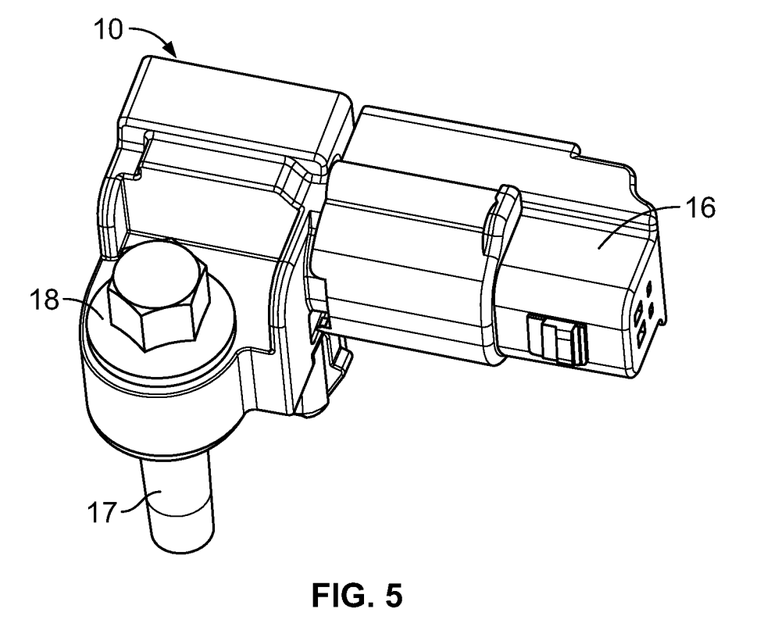
FIG. 5 is a side perspective view of the sensor with a bolt.
Figure 6:
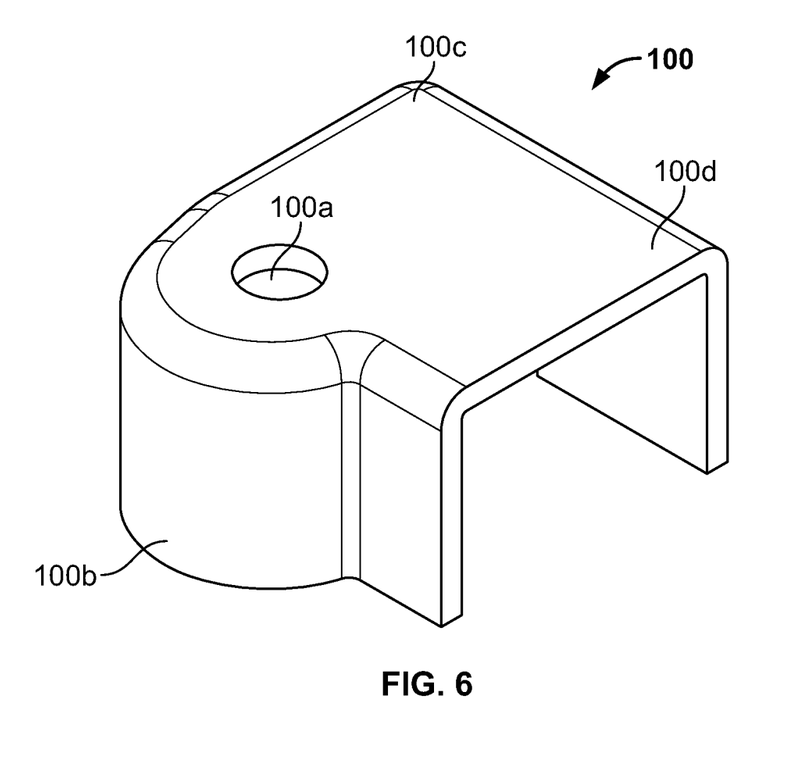
FIG. 6 is a front perspective view of a first cover.
Figure 7:
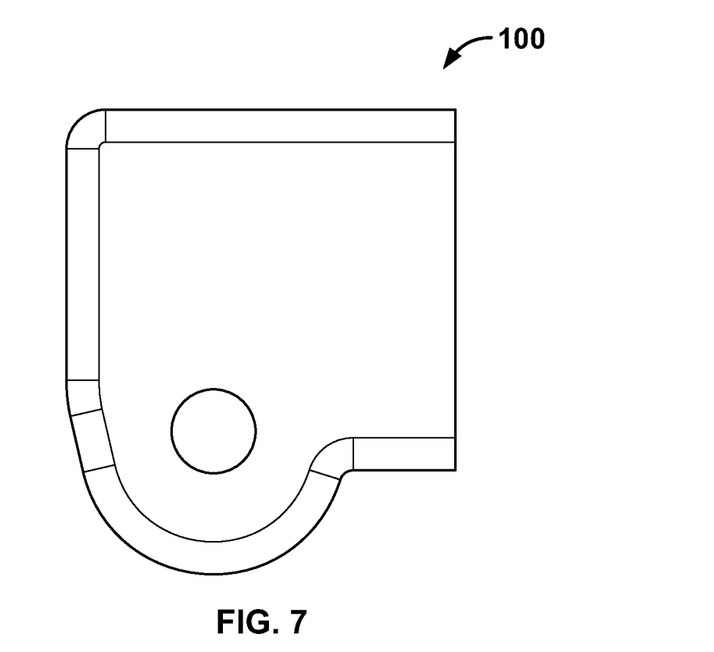
FIG. 7 is a top plan view of the first cover.
Figure 8:
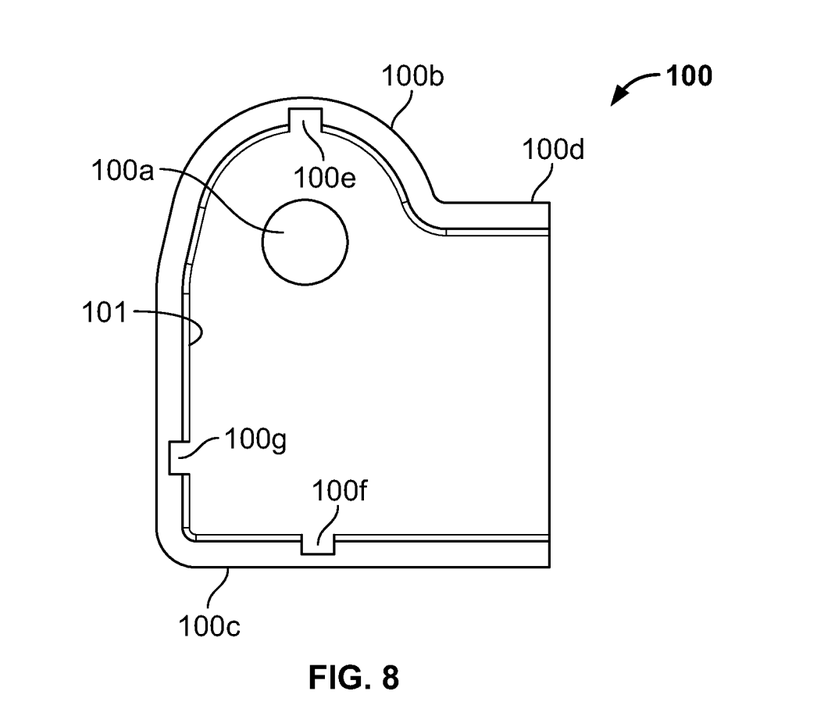
FIG. 8 is a bottom plan view of the first cover.

The power supply portion 11 is configured to receive a female power supply connector 16 as shown in FIG. 5. More specifically, the female power supply connector 16 slides over rails 11a, 11b, 11c, and 11d until approximately reaching the main housing portion 14. As shown in FIG. 1, the rails 11a, 11b, 11c, and 11d are flush with a terminal end of the power supply portion 11. The female power supply connector 16 includes one or more first power terminals that extend into power receiving slot 11e. The power receiving slot 11e includes one or more second power terminals that engage with the one or more first power terminals. The female power supply connector 16 thus provides electrical energy to the sensor 10.

The bolt connection portion 12 is configured to receiving a bolt 17 (see FIG. 5) therethrough to bind the sensor 10 to a separate structure (e.g., a vehicle or a trailer for a vehicle). The bolt connection portion 12 includes a bolt and bushing hole 12a, a first cover rail 12b, a cylindrical protrusion 12c, and a planar surface 12d. The cylindrical portion 12c cooperates with the planar surface 12d to define the bolt and bushing hole 12a.

The anti-rotation portion 13 is configured to fit into and snap against a corresponding anti-rotation feature (not shown) included on the separate structure (e.g., the vehicle or the trailer for the vehicle). The anti-rotation portion 13 prevents the sensor 10 from twisting or rotating while a user tightens the bolt in the bolt and bushing hole 12a. The anti-rotation portion 13a includes a tongue 13a, a lip 13b, and pillars 13c. Upon insertion into the corresponding anti-rotation feature, the tongue 13a and the lip 13b bend backwards until the lip 13b reaches a lip recess of the corresponding anti-rotation feature. Upon reaching the lip recess, the tongue 13a and the lip 13b snap forward and the lip 13b engages the lip recess. The anti-rotation feature is shaped as a slot that generally matches the outer perimeter defined by the pillars. As shown in FIG. 1, the outer perimeter of the pillars generally defines an oval shape. Therefore, the anti-rotation feature is an oval-shaped slot.

The main housing portion 14 contains the internal electronic components of the sensor 10. The main housing portion 14 includes a second cover rail 14a, a third cover rail 14b, a rectangular housing portion 14c, and a shoulder portion 14d. The internal electronic components of the sensor sit inside the rectangular housing portion 14c.

Figure 4:
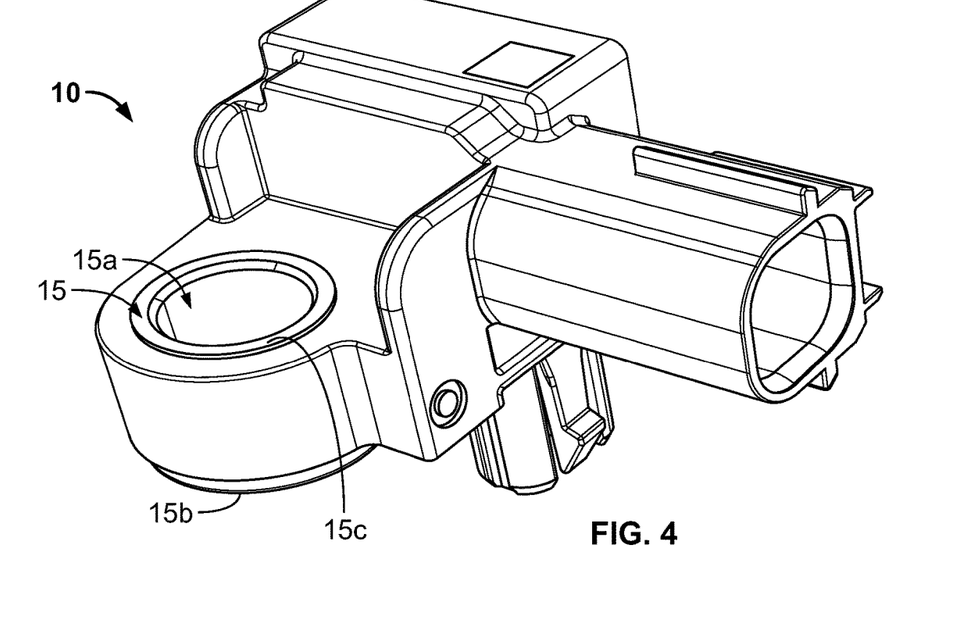
FIG. 4 is a front perspective view of the sensor with a nut.

FIG. 4 generally shows and illustrates the sensor 10 with a nut 15 positioned in the bolt and bushing hole 12a. The nut 15 includes a bolt hole 15a, a bottom nut protrusion 15b, and a top nut protrusion 15c. According to various embodiments, one or both of the bottom nut protrusion 15b and the top nut protrusion 15c vertically extend (i.e., protrude) out of the bolt and bushing hole 12a. The bottom nut protrusion 15b protrudes from the bottom of the bolt and bushing hole 12a. The top nut protrusion 15c protrudes from the top of the bolt and bushing hole.

FIG. 5 shows the sensor 10 (a) connected to the female power supply connector 16 and (b) receiving a bolt 17 and a washer 18. The bolt 17 extends through the bolt hole 15a of the nut 15. The washer 18 sits on one or both of the top nut protrusion 15c and the planar surface 12d.

FIGS. 6 to 9 show a first generic cover 100 for the sensor 10. The first generic cover 100 includes features (discussed below) that may appear on some or all of the other cover embodiments discussed below. The first generic cover 100 is configured to slip over the top of the sensor 100.

The first generic cover 100 includes a bolt hole 100a, a curved portion 100b sized to accommodate the bolt connection portion 12 of the sensor 10, a corner portion 100c sized to accommodate the main housing portion 14 of the sensor 10, a U-shaped garage portion 100d sized to accommodate a portion of the power supply portion 11, a first slot 100e sized to accommodate the first cover rail 12b, a second slot 100f sized to accommodate the second cover rail 14a, and a third slot 100g sized to accommodate the third cover rail 14b.

Figure 9A:
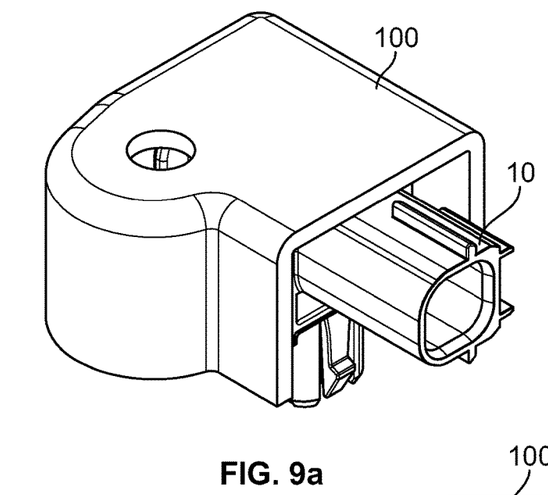
FIG. 9a is a front perspective view of the first cover mounted to the sensor.
Figure 9B:
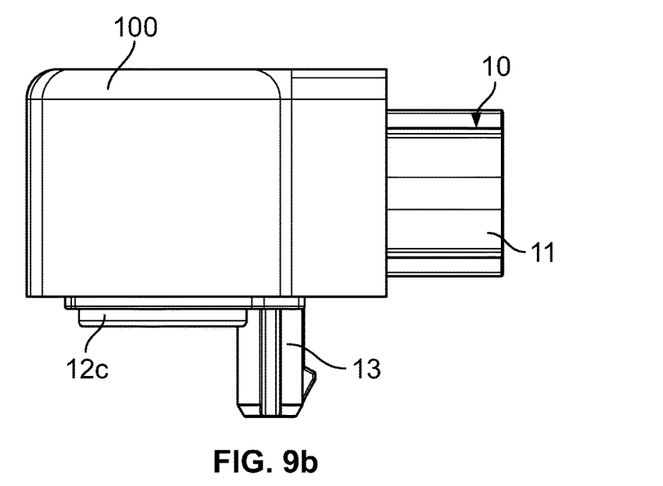
FIG. 9b is a side plan view of the first cover mounted to the sensor.
Figure 9C:
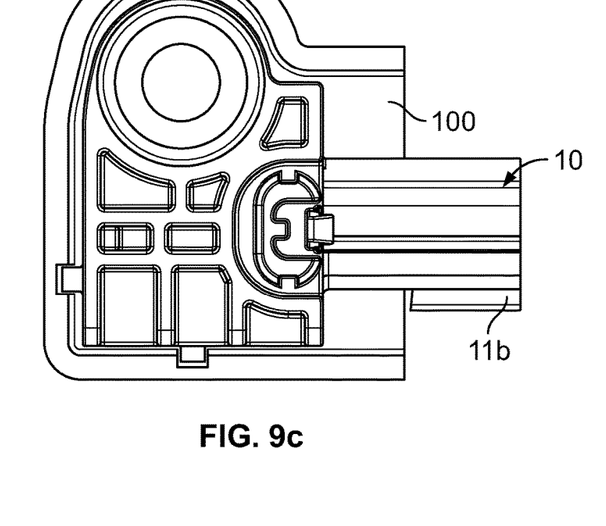
FIG. 9c is a bottom plan view of the first cover mounted to the sensor.
Figure 10:
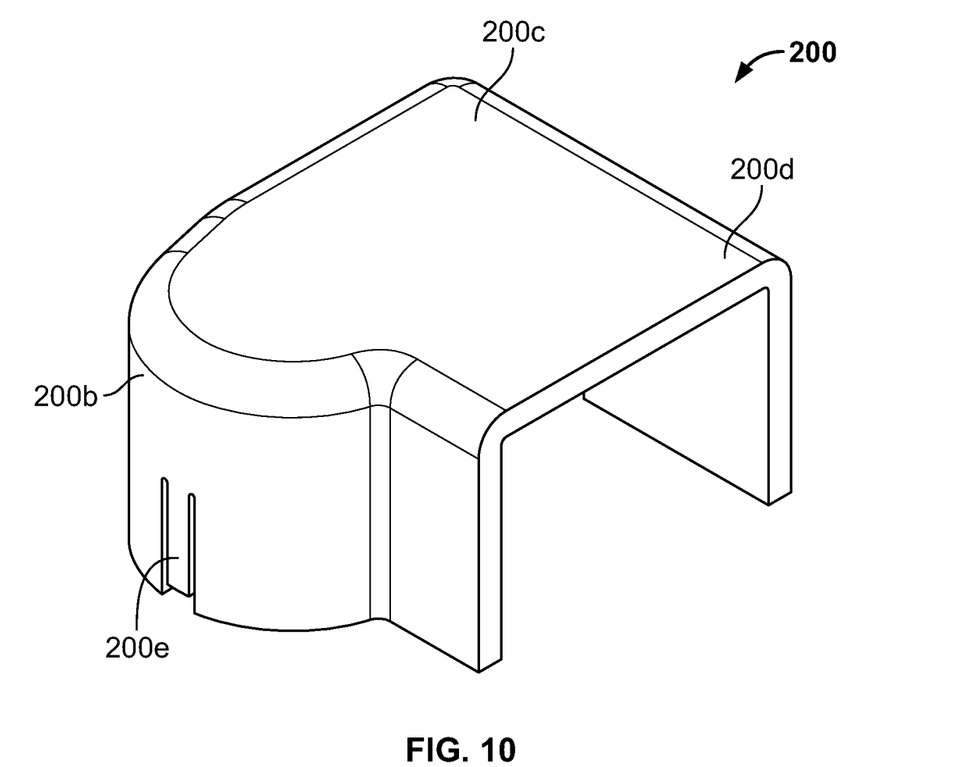
FIG. 10 is a front perspective view of a second cover.

As shown in FIGS. 9a to 9c, some or all of the interior walls of the curved portion 100b, the corner portion 100c, and the garage portion 100d contact corresponding exterior surfaces of the sensor 10. Thus, the inner perimeter of some or all of the curved portion 100b, the corner portion 100c, and the garage portion 100d match (e.g., are flush against) some of the outer perimeter of the sensor 10. As shown in FIGS. 9b and 9c, the first generic cover 100 exposes (i.e., does not cover) the cylindrical protrusion 12c of the sensor 10, the anti-rotation portion 13 of the sensor 10, and some or all of the rails 11a to 11d (e.g., at least rail 11b is exposed) of the sensor 10.

The first slot 100e, the second slot 100f, and the third slot 100g discourage the first generic cover 100 from twisting or rotating with respect to the sensor 10. The bolt hole 100a is optional since in some embodiments, the bolt 17 and the washer 18 are secured to the sensor 10 prior to dropping the first generic cover 100 on the sensor 10.

As previously stated, some or all of the features of the first generic cover 100 are common or generic to other embodiments of the cover. More specifically, other embodiments of the cover may include the slots 100e, 100f, and 100g, and the bolt hole 100a. The other embodiments over the cover may also include inner perimeters that match (e.g., are flush against) some of the outer perimeter of the sensor 10. The other embodiments may expose (i.e., not cover) the cylindrical protrusion 12c of the sensor 10, the anti-rotation portion 13 of the sensor 10, and some or all of the rails 11a to 11d (e.g., at least rail 11b is exposed) of the sensor 10.

FIGS. 10 to 14 generally shows and illustrate a second cover 200. The second cover 200, similar to the first generic cover 100, includes a curved portion 200b sized to accommodate the bolt connection portion 12 of the sensor 10, a corner portion 200c sized to accommodate the main housing portion 14 of the sensor 10, and a U-shaped garage portion 200d sized to accommodate a portion of the power supply portion 11.

The illustrated second cover 200 does not include a bolt hole, although various embodiments may include a bolt hole similar to the bolt hole 100a of the first generic cover 100. The second cover 200 includes a first snap slot 200e, a second snap slot 200f, and a slot 200g. The snap slots 200e and 200f include a snap fit feature similar to the anti-rotation portion 13 of the sensor 10. Each snap fit feature includes a tongue and a lip, similar to the tongue 13a and lip 13b of the sensor 10. The tongue of each snap fit feature is recessed from an inner perimeter 201 of the second cover 200 to receive the first and second cover rails 12b and 14a. The lip of each snap fit feature snaps to and grasps an underside of the first and second cover rails 12b and 14a. The slot 200g is substantially similar to the third slot 100g of the first generic cover 100.

Figure 11:
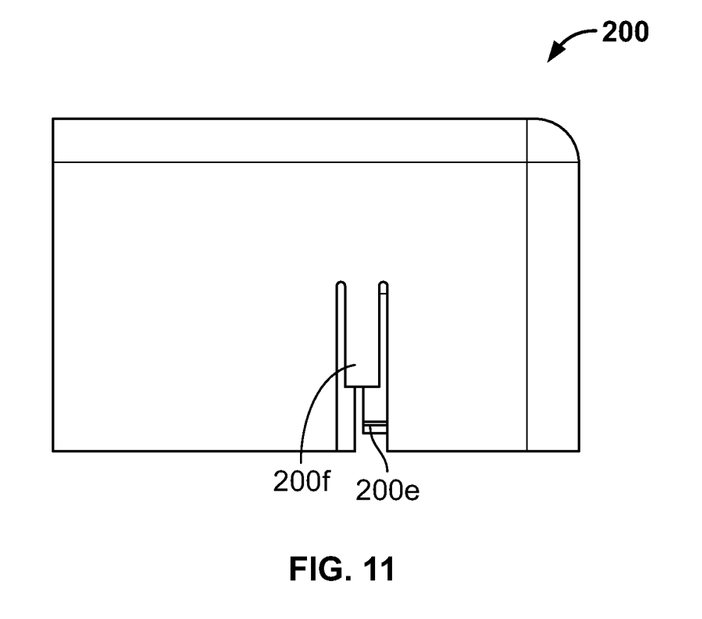
FIG. 11 is a side plan view of the second cover.
Figure 12:
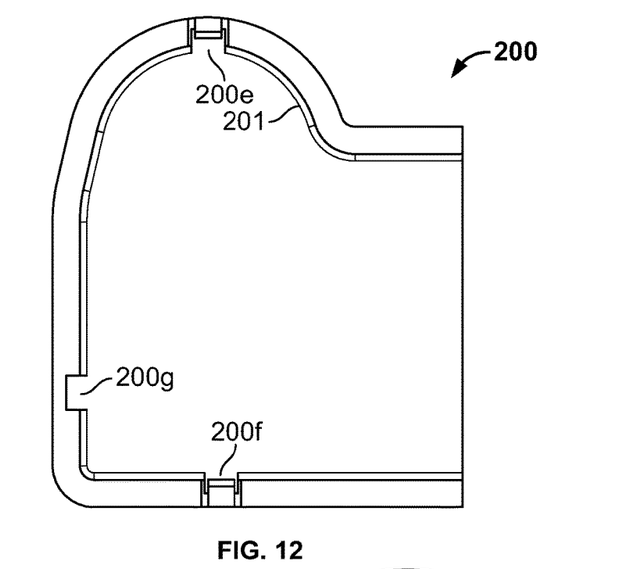
FIG. 12 is a bottom plan view of the second cover.
Figure 13:
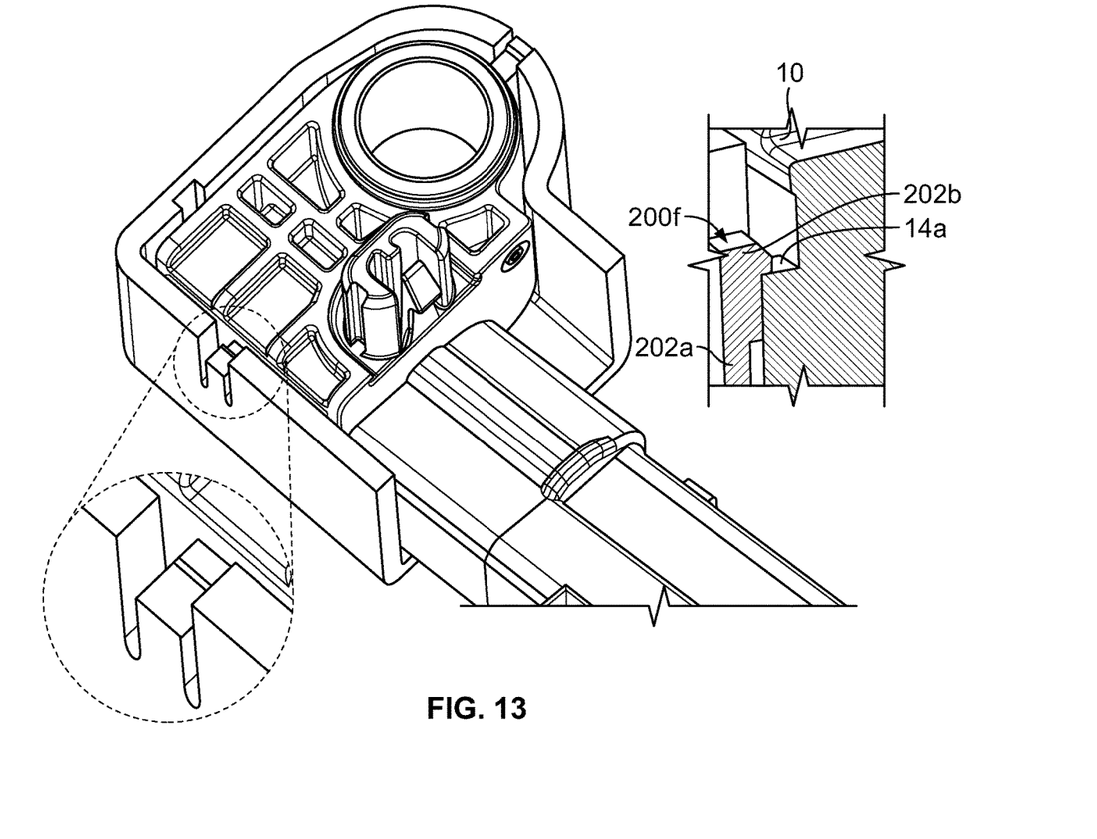
FIG. 13 is a bottom perspective view of the second cover mounted to the sensor.

FIG. 13 generally shows and illustrates a tongue 202a and a lip 202b of the snap fit feature of the second snap slot 200f. The lip 202b has snapped on to and grasped the underside of the second cover rail 14a of the sensor 10. As shown in FIG. 11, the snap fit features of the snap slots 200e and 200f need not be identical. For example, and as shown in FIG. 11, the tongue of the snap fit feature of the second snap slot 200f is shorter than the tongue of the snap fit feature of the first snap slot 200e. The lips of the snap fit features may be identical. The disparity in length of the tongues may advantageously discourage the cover 200 from flipping (i.e., rotating about an axis parallel and extending through the power receiving slot 11e). Snap slot 200e opposes snap slot 200f, which advantageously discourages both of the snap slots 200e and 200f from disengaging during use (e.g., rotation and disengagement of one snap slot 200e or 200f is opposed by the opposing snap slot 200f or 200e).

Figure 14:
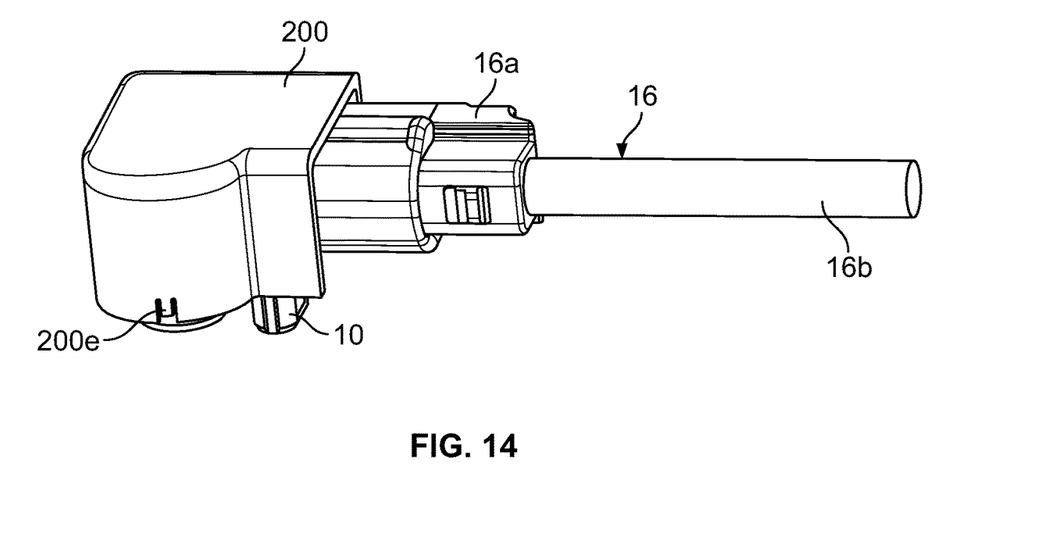
FIG. 14 is a side perspective view of the second cover mounted to the sensor.

FIG. 14 shows the second cover 200 attached to the sensor 10, which is secured to the female power supply connector 16.

Figure 15:
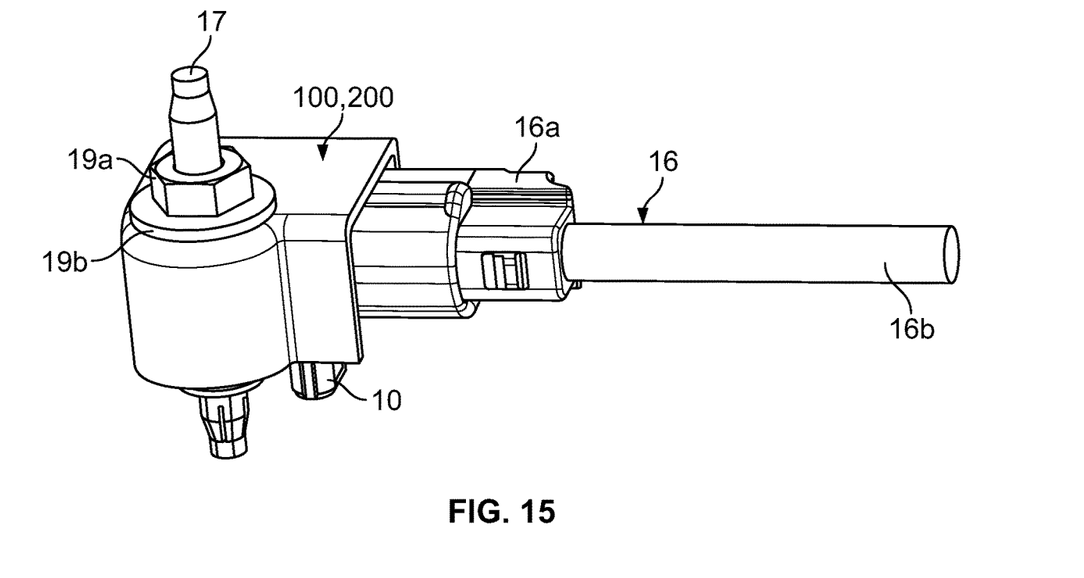
FIG. 15 is a side perspective view of the first or second cover mounted to the sensor.

FIG. 15 shows the first generic cover 100 or the second cover 200 mounted on the sensor 10 via a bolt 17, and a second washer 19. The bolt 17 extends through the nut 15, the washer 18 (not shown), and the second washer 19. The second washer 19 includes a threaded portion 19a and a plate portion 19b. The threaded portion 19a has an outer hexagonal surface that enables tightening of the cover 100, 200 with respect to the sensor 10. The plate portion 19b distributes load across a top surface of the cover 100, 200.

Figure 16:
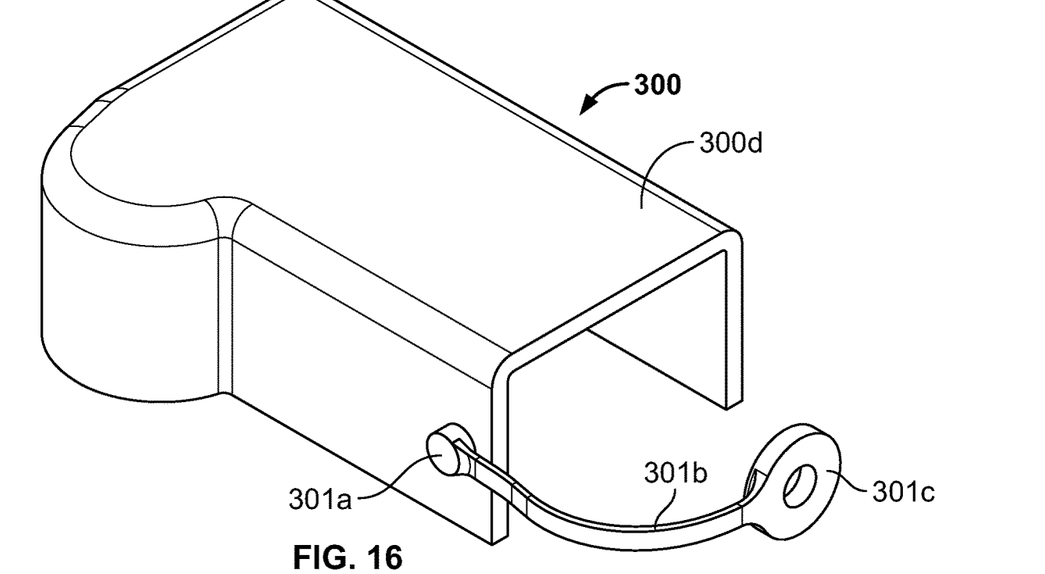
FIG. 16 is a front perspective view of a third cover.
Figure 17:
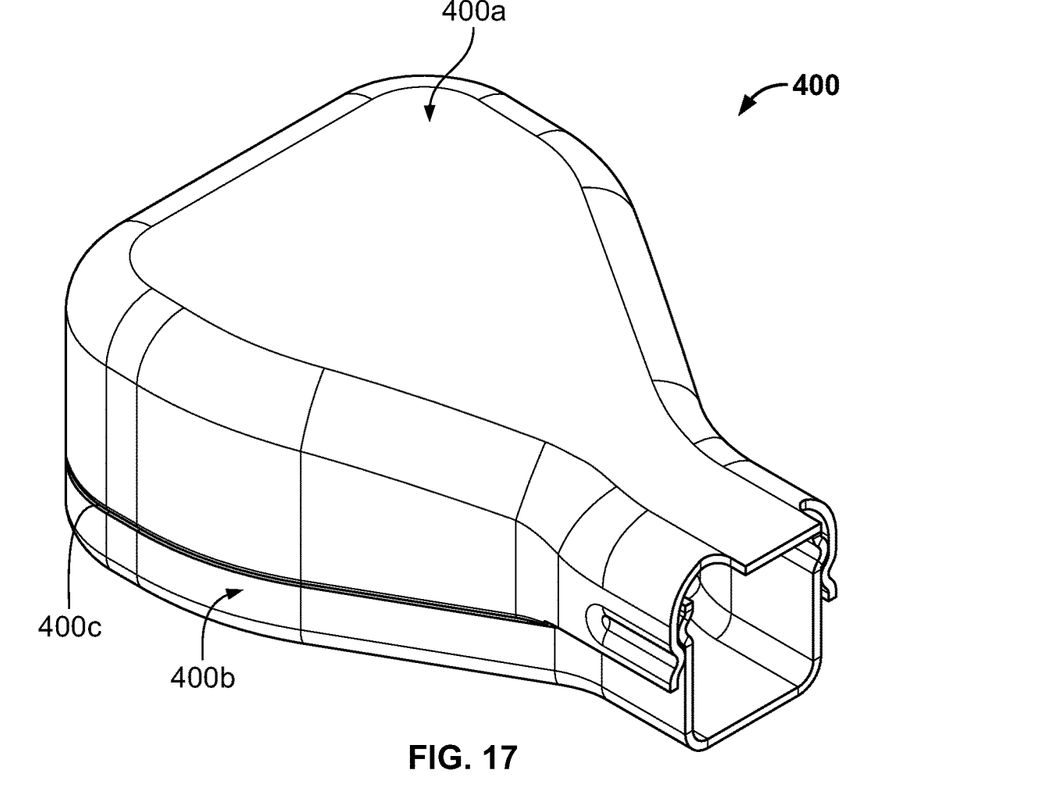
FIG. 17 is a front perspective view of a fourth cover.

FIG. 16 shows a third cover 300. The third cover 300 is similar to the first generic cover 100 and the second cover 200. The garage portion of the third cover, however, extends further than the garage portions 100d, 200d of the first and second covers 100, 200. More specifically, the garage portion 300d of the third cover 300 extends to cover the power supply portion 11 of the sensor 10, when the third cover 300 is dropped over the sensor 10. The third cover 300 may include some or all of the internal features of the first and second covers 100, 200, including the slots 100d, 100e, 100f and/or the snap slots 200e, 200f.

As shown in FIG. 16, the third cover 300 includes an attachment ribbon 301. The ribbon 301 includes an attachment point 301a, a flexible extension 301b, and a hoop 301c. The hoop 301c is sized to fit around a cylindrical cable 16b of the female power supply connector 16, as opposed to a primary portion 16a of the female power supply connector 16. During manufacturing, an engineer may place the hoop 301c about the cylindrical cable of the female power supply connector 16, and then connect the cylindrical cable of the female power supply connector 16 to a power source (e.g., a battery). The attachment ribbon enables a user to remove the third cover 300 from the sensor 10, without the third cover 300 falling to the ground and thus picking up dirt or debris. It should be appreciated that some or all of the other embodiments of the cover may include the attachment ribbon 301.

FIGS. 17 to 23 generally show and illustrate a fourth cover 400, which is shaped and dimensioned to cover both the top and bottom of the sensor 10 while leaving space for the female power supply connector 16. The fourth cover 400 includes a top housing 400a joined to a bottom housing 400b along an interface 400c. The interface 400c may be a flexible gasket joined to the top housing 400a or the bottom housing 400b.

Figure 23:
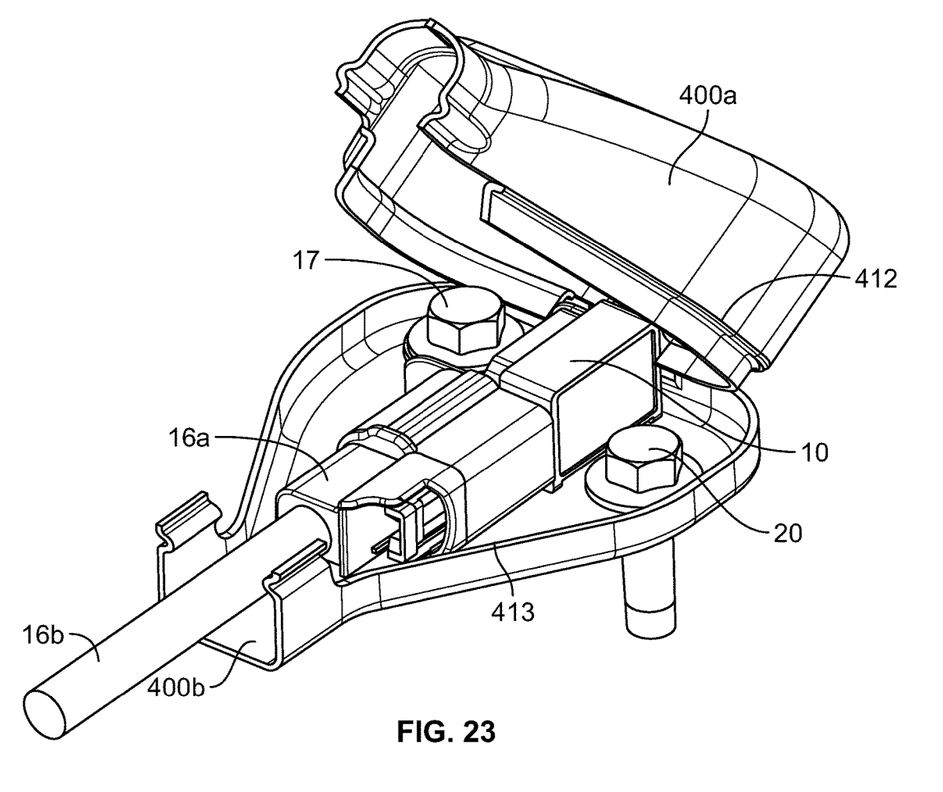
FIG. 23 is a side perspective view of the fourth cover mounted to the sensor.

With reference to FIG. 23, the top housing 400a may include a plurality of outer ribs 412. The lower-most outer rib 412 may engage with an upper sealing surface 413 of the bottom housing 400b. The outer ribs 412 enhance the strength of the engagement between the top housing 400a and the bottom housing 400b. The flexible gasket, if present, may be joined to the upper sealing surface 413 of the bottom housing 400b or the outer ribs 412 of the top housing 400a.

Figure 18:
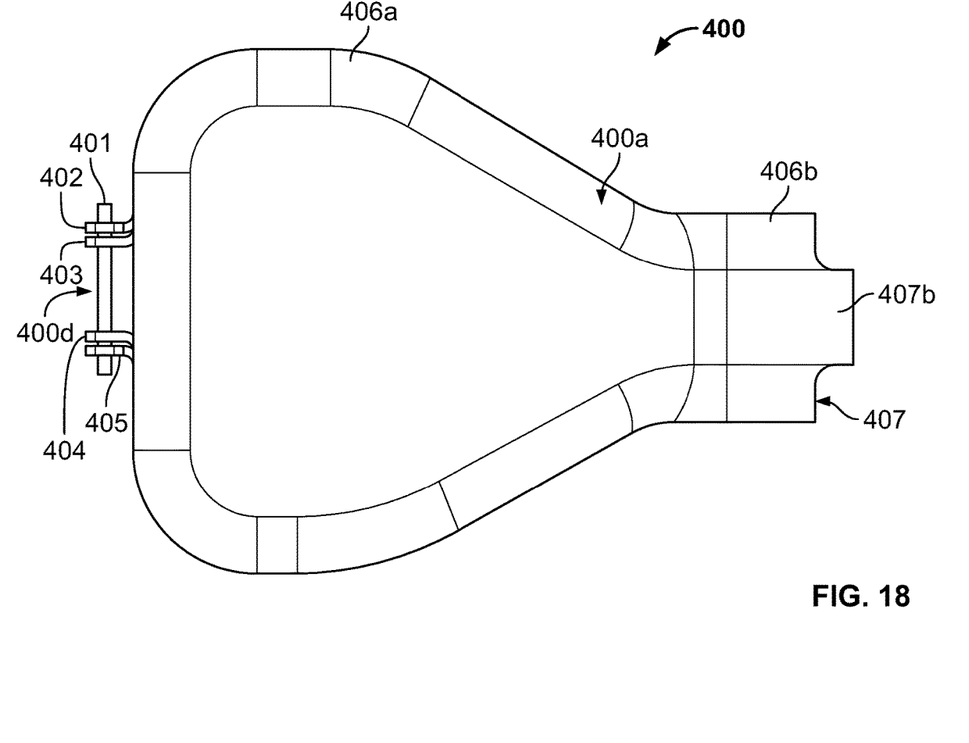
FIG. 18 is a top plan view of the fourth cover.
Figure 19:
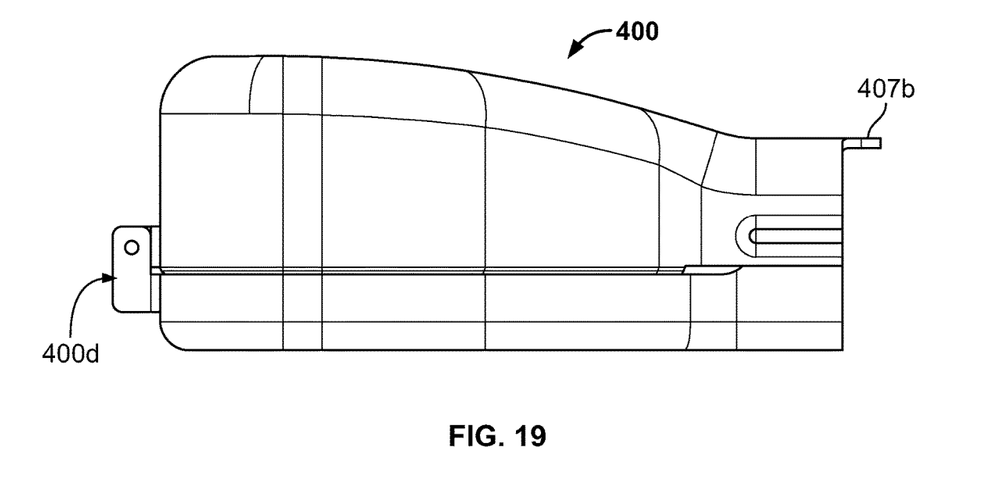
FIG. 19 is a side plan view of the fourth cover.
Figure 20:
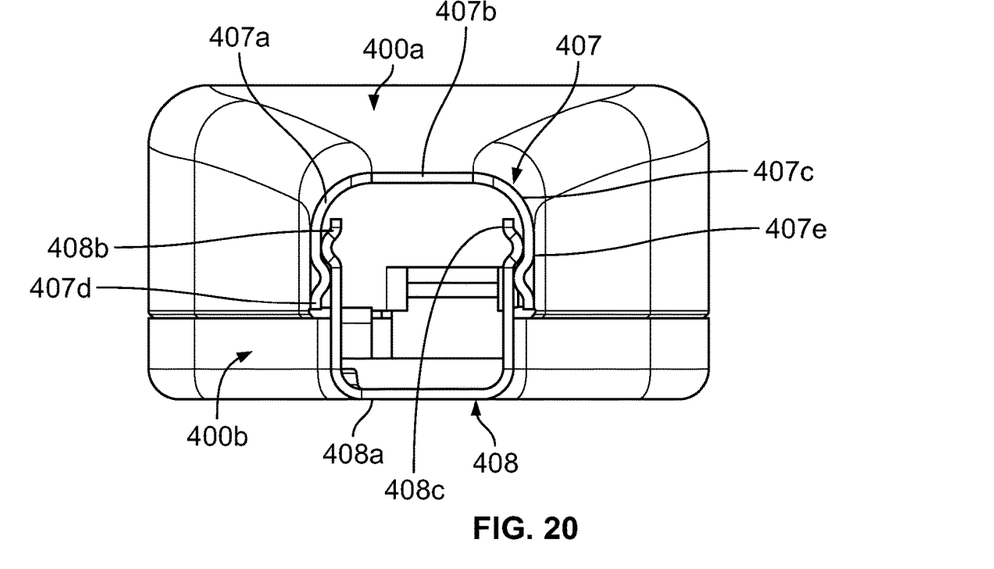
FIG. 20 is a front plan view of the fourth cover.

With reference to FIG. 18, the top housing 400a is rotatable about the bottom housing 400b via a joint or hinge 400d. FIG. 23 shows the top housing 400a in the rotated or open position. FIGS. 19 and 20 show the top housing 400a in the closed position (i.e., interfacing with bottom housing 400b). The joint or hinge 400d may be a pin hinge 400d with a pin 401 disposed through four retainers 402, 403, 404, and 405. First retainer 402 and fourth retainer 405 are identically shaped and integral with and projected from the bottom housing 400b. Second retainer 403 and third retainer 404 are identically shaped and integral with and projected from the top housing 400a. The retainers 402 to 405 have a flat rectangular shape. Each retainer 402 to 405 defines an aperture sized to accommodate the pin 401. According to some embodiments, the apertures of each retainer 402 to 405 are identically sized. After fitting the pin 401 through the apertures of the retainers 402 to 405, plastic retaining clips may be connected to the opposing ends of the pin 401 to prevent the pin 401 from disengaging from any of the retainers 402 to 405.

With continued reference to FIG. 18, the top housing 400a includes a triangular portion 406a that narrows into a rectangular extension portion 406b. It should be appreciated that narrowing portion is curved (i.e., does not include sharp edges) to enhance strength. The extension portion 406b defines a plurality of first terminal surfaces 407, including a hood 407b. It should be appreciated that the triangular geometry of the top housing 400a provides room for the sensor while restricting the amount of room for the female power supply connector 16 and thus ingress of water or dirt.

Turning to FIG. 20, the first terminal surfaces 407 of the top housing 400a are generally configured to mate or engage with second terminal surfaces 408 of the bottom housing 400b. Engagement of the first and second terminal surfaces 407, 408 discourages the top housing 400a from rotating with respect to the bottom housing 400b while the vehicle is in motion.

As shown in FIG. 20, the first terminal surfaces 407 include a first upper rounded portion 407a and a second upper rounded portion 407c separated by the hood 407b. The first upper rounded portion 407a transitions into a first upper indented portion 407d having a first inward indentation or bend. The second upper rounded portion 40c transitions into a second upper indented portion 407e having a second inward indentation or bend.

The second terminal surfaces 408 include a U-shaped lower portion 408a that transitions into (a) a first lower indented portion 408b having a first outward indentation or bend and (b) a second lower indented portion 408c having a second outward indentation or bend.

As shown in FIG. 20, the first inward indentation engages the first outward indentation and the second inward indentation engages the second outward indentation when the top housing 400a is in the closed position. The outward indentations are located about the inward indentations, thus discouraging or inhibiting upward rotation of the top housing 400a with respect to the bottom housing 400b. As a result, the fourth cover 400 includes a dual snap feature.

Figure 21:
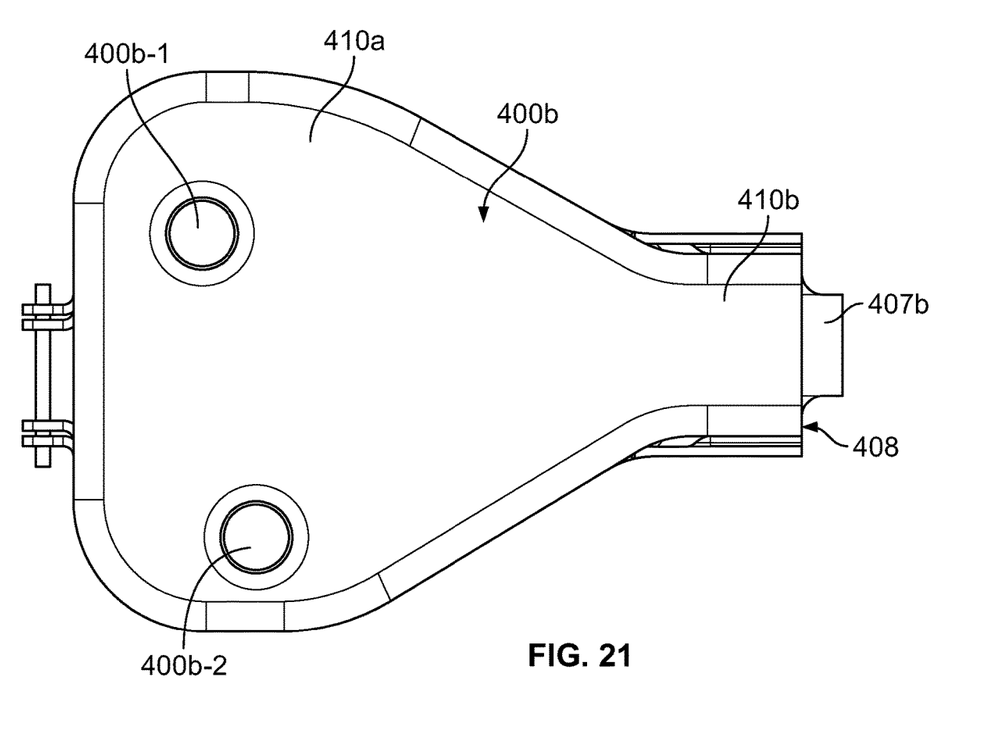
FIG. 21 is a bottom plan view of the fourth cover.

With reference to FIG. 21, the bottom housing 400b includes a triangular portion 410a that narrows into a rectangular extension portion 410b. It should be appreciated that narrowing portion is curved (i.e., does not include sharp edges) to enhance strength. The triangular portion 410a defines a first aperture 400b-1 and a second aperture 400b-2. The apertures are offset from each other (e.g., are not collinear along a line parallel to the pin 401). More specifically, the first aperture 400b-1 is closer to the joint 400d than the second aperture 400b-2.

Figure 22:
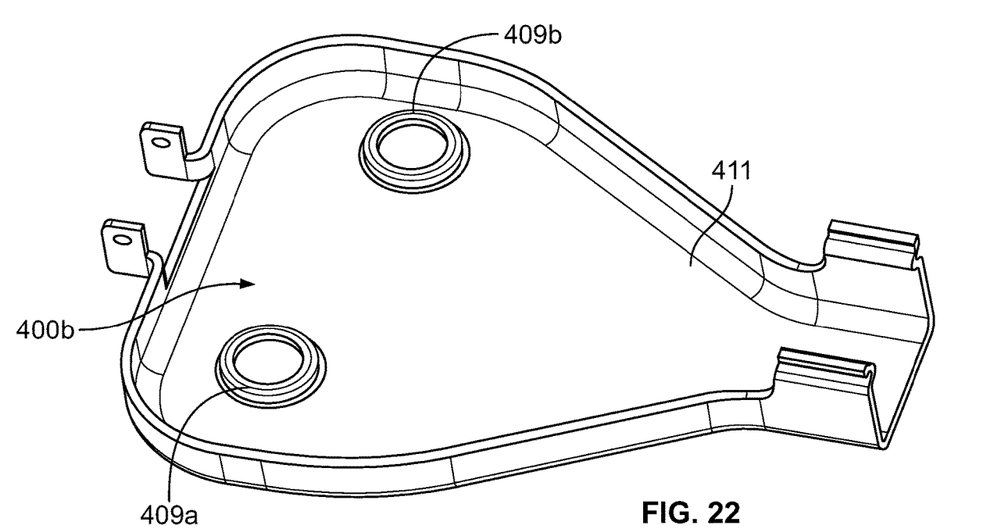
FIG. 22 is a top perspective view of a bottom housing of the fourth cover.

With reference to FIG. 22, the bottom housing 400b includes a boss with raised circular ribs 409a surrounding the first aperture 400b-1 and a second boss with raised circular ribs 409b surrounding the second aperture 400b-2. The raised ribs of the bosses (a) enhance strength and/or toughness of the surfaces defining the apertures and (b) elevate the sensor 10 and the female power supply connector 16 from an upper surface 411 of the bottom housing 400b. Elevation advantageously enables the sensor 10 to remain dry if water breaches the fourth cover 400 and floods the upper surface 411 of the bottom housing 400b. According to some embodiments, the upper surface 411 of the bottom housing 400b defines a plurality of drains (not shown) to expel water.

FIG. 23 shows the sensor 10 installed in the fourth cover 10. The sensor 10 (and thus the female power supply connector 16) are elevated above the upper surface 411 of the bottom housing by virtue of the boss 409a. More specifically, and with reference to FIG. 4, the bottom nut protrusion 15b sits on top of the first boss 409a. The bolt 17 extends through the first aperture 400b-1. A second bolt 20 extends through the second aperture 400b-2. This sensor 10 may lack the anti-rotation portion 13. According to other embodiments, the sensor 10 includes the anti-rotation portion 13 and the bottom housing 400b defines a suitable void to accommodate the anti-rotation portion 13. As shown in FIG. 23, the top housing 400a and the bottom housing 400b are dimensioned to fully enclose the sensor 10 and the primary portion 16a of the female power supply connector 16.

It should be appreciated that the polarity of the indentations is reversed in FIG. 23. More specifically, the top housing 400a now includes outward indentations and the bottom housing 400b now includes inward indentations. The outward indentations of the top housing 400a sit below the inward indentations of the bottom housing 400b such that the first terminal surfaces 407 are partially encompassed or surrounded by the second terminal surfaces 408.

The invention claimed is:

1. An assembly for a vehicle comprising:
   a top housing rotatable about a bottom housing via a hinge; and
   a sensor positioned between the top and bottom housings;
   the top and bottom housings each comprising:

a housing wall having a triangular shape;

a rear wall extending from the housing wall, the rear walls of the top and bottom housings having the hinge positioned thereon; and sidewalls extending from the rear wall and the housing wall, the side walls and the housing wall defining a triangular portion that narrows into a rectangular extension portion defining an opening, wherein the triangular portion is positioned between the rectangular extension portion and the rear wall, the bottom housing comprising raised bosses defining bolt apertures.

2. The assembly of claim 1, wherein the top housing is rotatable about the bottom housing to an open position and a closed position.

3. The assembly of claim 2, the top housing defining outward indentations and the lower housing defining corresponding inward indentations, wherein, in the closed position, the outward indentations sit on the inward indentations.

4. The assembly of claim 3, wherein, in the closed position, the indentations cooperate to retain the top housing in the closed position.

5. The assembly of claim 4, wherein the inward indentations are symmetrical and the outward indentations are symmetrical.

6. The assembly of claim 5, wherein the top housing comprises a hood outwardly protruding from the extension portion of the top housing.

7. The assembly of claim 3, wherein, in the closed position, the entire inward indentations are positioned between the entire outward indentations.

8. The assembly of claim 1, wherein the hinge comprises two apertures defined by two parts protruding from the top housing and another two apertures defined by another two parts protruding from the bottom housing.

9. The assembly of claim 8, wherein a pin extends through the apertures.

10. The assembly of claim 1, wherein the bottom housing comprises an upper surface and the bosses are raised above the upper surface.

11. The assembly of claim 1, wherein the triangular portions smoothly and continuously narrow into the rectangular extension portions such that the triangular portions do not define corners.

12. The assembly of claim 1, the top housing defining outward indentations and the lower housing defining corresponding inward indentations, wherein the outward indentations are defined by the rectangular extension portion of the upper housing and the inward indentations are defined by the rectangular extension portion of the lower housing.

13. The assembly of claim 1, wherein the top housing further comprises a pair of upper indented portions, and the bottom housing further comprises a pair of lower indented portions, the pair of upper indented portions respectively defining a pair of first indentations, the pair of lower indented portions respectively defining a pair of second indentations, wherein the directions at which the pair of first indentations are indented face away from each other, and wherein the directions at which the pair of inward indentations are indented face each other.

14. An assembly for a vehicle comprising:
a top housing rotatable about a bottom housing via a hinge;
a sensor positioned between the top and bottom housings;
the top and bottom housings each comprising a triangular portion that narrows into a rectangular extension portion;
the bottom housing comprising raised bosses defining bolt apertures;
the housings comprising outward indentations and corresponding inward indentations,
wherein the bottom housing comprises an upper surface and the bosses are raised above the upper surface, and wherein the sensor sits on at least one of the bosses such that no portion of the sensor contacts the upper surface of the bottom housing.

15. An assembly for a vehicle comprising:
a top housing rotatable about a bottom housing via a hinge;
a sensor positioned between the top and bottom housings;
the top and bottom housings each comprising a triangular portion that narrows into a rectangular extension portion;
the bottom housing comprising raised bosses defining bolt apertures;
the housings comprising outward indentations and corresponding inward indentations,
wherein the bottom housing comprises an upper surface and the bosses are raised above the upper surface, and wherein the sensor comprises a bolt connector defining a bolt aperture and a nut fitted inside the bolt aperture.

16. The assembly of claim 15, wherein the nut is longer than the bolt aperture such that a lower surface of the nut protrudes from the bolt aperture.

17. The assembly of claim 16, wherein the lower surface of the nut sits directly on the boss.

18. The assembly of claim 17, wherein the bosses are offset such that the bosses are not collinear along a line extending parallel to the hinge.

19. The assembly of claim 1, comprising an electrical connector engaged to the sensor, the electrical connector including a primary portion and a cord;
wherein the top and bottom housings are sized to cover the sensor, the primary portion of the electrical connector, and only a portion of the cord.

20. The assembly of claim 1, wherein the top housing comprises a plurality of outer ribs.

21. The assembly of claim 20, wherein the ribs engage an upper sealing surface of the bottom housing when the top housing is in the closed position.

22. The assembly of claim 21, comprising an attachment ribbon with a flexible extension and a hoop.

* * * * *